(12) United States Patent
Samuels

(10) Patent No.: US 9,531,330 B2
(45) Date of Patent: Dec. 27, 2016

(54) LOW NOISE AMPLIFIER FOR MULTIPLE CHANNELS

(71) Applicant: Analog Devices, Inc., Norwood, MA (US)

(72) Inventor: Howard R. Samuels, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/718,328

(22) Filed: May 21, 2015

(65) Prior Publication Data

US 2015/0256133 A1 Sep. 10, 2015

Related U.S. Application Data

(63) Continuation of application No. 13/716,258, filed on Dec. 17, 2012, now Pat. No. 9,041,463.

(60) Provisional application No. 61/576,521, filed on Dec. 16, 2011.

(51) Int. Cl.
| | |
|---|---|
| *H03F 3/68* | (2006.01) |
| *H03F 1/26* | (2006.01) |
| *G01P 15/125* | (2006.01) |
| *G01P 15/18* | (2013.01) |
| *H03F 3/45* | (2006.01) |
| *H03F 3/04* | (2006.01) |
| *G01P 15/08* | (2006.01) |

(52) U.S. Cl.
CPC ............. *H03F 1/26* (2013.01); *G01P 15/125* (2013.01); *G01P 15/18* (2013.01); *H03F 3/04* (2013.01); *H03F 3/45071* (2013.01); *H03F 3/45475* (2013.01); *H03F 3/68* (2013.01); *G01P 2015/082* (2013.01); *H03F 2200/129* (2013.01); *H03F 2200/171* (2013.01); *H03F 2200/261* (2013.01); *H03F 2200/333* (2013.01); *H03F 2203/45512* (2013.01); *H03F 2203/45544* (2013.01)

(58) Field of Classification Search
CPC .............................................. H03F 2203/21142
USPC ................................ 330/148, 186, 197, 200
See application file for complete search history.

(56) References Cited

U.S. PATENT DOCUMENTS

| | | | |
|---|---|---|---|
| 5,224,380 A | 7/1993 | Paik | 73/510 |
| 5,894,090 A | 4/1999 | Tang et al. | 73/504.02 |
| 6,148,670 A | 11/2000 | Judy | 73/514.32 |

(Continued)

FOREIGN PATENT DOCUMENTS

| | | | |
|---|---|---|---|
| CN | 101788567 A | 7/2010 | G01P 9/04 |
| EP | 1 703 287 | 9/2006 | |

OTHER PUBLICATIONS

Nakamura, "MEMS Inertial Sensor toward Higher Accuracy & Multi-axis Sensing," IEEE, pp. 939-942, 2005.

(Continued)

*Primary Examiner* — Khanh V Nguyen
*Assistant Examiner* — Khiem Nguyen
(74) *Attorney, Agent, or Firm* — Sunstein Kann Murphy & Timbers LLP

(57) ABSTRACT

An amplifier system has an amplifier for amplifying a plurality of input signals from a plurality of different channels, and a plurality of demodulators each operatively coupled with the amplifier for receiving amplified input signals from the amplifier. Each demodulator is configured to demodulate a single amplified input channel signal from a single channel of the plurality of different channels. The system thus also has a plurality of filters, coupled with each of the demodulators, for mitigating the noise.

20 Claims, 4 Drawing Sheets

(56) References Cited

U.S. PATENT DOCUMENTS

| | | | |
|---|---|---|---|
| 6,229,856 B1 | 5/2001 | Diab et al. | 375/316 |
| 6,334,060 B1 | 12/2001 | Sham et al. | 455/500 |
| 6,386,032 B1 | 5/2002 | Lemkin et al. | 73/504.02 |
| 6,761,069 B2 | 7/2004 | Hollocher et al. | 73/514.18 |
| 7,252,001 B2 | 8/2007 | Boletis et al. | 73/514.17 |
| 7,336,357 B2 | 2/2008 | Levy | 356/328 |
| 8,205,497 B1 | 6/2012 | Okandan et al. | 73/514.26 |
| 8,813,565 B2 | 8/2014 | Caminada et al. | 72/504.12 |
| 2008/0221805 A1 | 9/2008 | Andrews | 702/19 |
| 2010/0054281 A1 | 3/2010 | Terazawa et al. | 370/480 |

OTHER PUBLICATIONS

Tavakoli et al., "An Offset-Canceling Low-Noise Lock-In Architecture for Capacitive Sensing," IEEE Journal of Solid-State Circuits, vol. 38, No. 2, pp. 244-253, 2003.

International Searching Authority, International Search Report—International Application No. PCT/US2012/070057, dated Mar. 21, 2013, together with the Written Opinion of the International Searching Authority, 10 pages.

International Searching Authority, International Search Report—International Application No. PCT/US2012/069755, dated Mar. 13, 2013, together with the Written Opinion of the International Searching Authority, 11 pages.

European Patent Office, Communication Pursuant to Rules 161(1) and 162 EPC, Application No. 12809960.3-1805, dated Jul. 23, 2014, 2 pages.

Wallin, Response to Communication pursuant to Rules 161(1) and 162 EPC, Application No. 12809960.3, dated Nov. 28, 2014, 25 pages.

European Patent Office, Communication Pursuant to Article 94(3) EPC, Application No. 12809960.3-1805, dated Apr. 23, 2015, 5 pages.

LOW NOISE AMPLIFIER FOR MULTIPLE CHANNELS

PRIORITY

This patent application is a continuation of, and claims priority from, U.S. patent application Ser. No. 13/716,258, filed Dec. 17, 2012 entitled "Low Noise Amplifier for Multiple Channels," with an issue date of May 26, 2015 as U.S. Pat. No. 9,041,463, and naming Howard R. Samuels as inventor, and also claims priority from provisional U.S. patent application No. 61/576,521, filed Dec. 16, 2011 entitled, "Low Noise Amplifier for Multiple Channels," and naming Howard R. Samuels as inventor, the disclosures of which are incorporated herein, in their entirety, by reference.

RELATED APPLICATIONS

This patent application is related to U.S. patent application Ser. No. 13/328,177, filed on Dec. 16, 2011, and published as U.S. patent application publication number US 2013/0152686 on Jun. 20, 2013, entitled, "SYSTEM AND METHOD OF REDUCING NOISE IN A MEMS DEVICE," and naming Srinivasan Venkatraman as inventor, the disclosure of which is incorporated herein, in its entirety, by reference.

FIELD OF THE INVENTION

The invention generally relates to electronic signal amplification and, more particularly, the invention relates to low noise amplification.

BACKGROUND OF THE INVENTION

Microelectromechanical systems ("MEMS") are used in a growing number of applications. For example, MEMS currently are implemented as gyroscopes for stability control systems in automobiles, as microphones in acoustic systems, and as accelerometers to selectively deploy air bags in automobiles. In simplified terms, such MEMS devices typically have a structure suspended above a substrate, and associated electronics that both senses movement of the suspended structure and delivers the sensed movement data (or position data) to one or more external devices (e.g., an external computer). The external device processes the sensed data to calculate the property being measured (e.g., pitch angle, an incident acoustic signal, or acceleration).

In many applications, the suspended, movable mass may form a variable capacitor with a fixed electrode. Movement of the mass of, for example, an accelerometer, is represented by a variable capacitance signal the capacitor produces in response to actual acceleration. In multi-dimensional accelerometers, this can produce two or three respective capacitance signals—up to one for each dimension along a Cartesian coordinate system.

State of the art accelerometers use time division multiplexing techniques to forward those multiple variable capacitance signals toward the MEMS output. Time division multiplexing, however, produces aliasing noise, undesirably reducing the signal to noise ratio. Those in the art have responded to this problem by using MEMS devices that produce a sufficiently large signal to overcome the noise produced by this multiplexing technique. This typically requires a larger MEMS device, which often is more expensive, requires more power, and takes up more real estate. Devices other than MEMS devices can suffer from similar issues. Discussion of MEMS devices thus is exemplary.

SUMMARY OF THE INVENTION

In accordance with one embodiment of the invention, an amplifier system has an amplifier for amplifying a plurality of input signals from a plurality of different channels, and a plurality of demodulators each operatively coupled with the amplifier for receiving amplified input signals from the amplifier. Each demodulator is configured to demodulate a single amplified input channel signal from a single channel of the plurality of different channels. In addition, each demodulator produces noise related to at least one of the channels other than the single channel (i.e., the other channels). For example, during demodulation, an X-channel demodulator receives the amplified signals of an X-channel, a Y-channel, and a Z-channel. The X-channel demodulator produces the baseband X-channel signal and noise related to the received signals for the Y-channel and Z-channel. This noise is higher frequency than the baseband X-channel signal. The system thus also has a plurality of filters, coupled with each of the demodulators, for mitigating the noise.

The noise on the demodulators may include high frequency noise, such as clock frequency noise (i.e., noise at frequencies related to the clock, but not at baseband). Accordingly, the filter may include a low pass filter configured with a cutoff to mitigate the high frequency noise. Moreover, the input signals may have clocks that are in quadrature and with substantially the same frequencies. In a similar manner, the input signals may clocks with coincident edges and frequencies that are related by multiples of 2 or multiples of 0.5.

Among other types, the amplifier may include an integrator. In addition, the plurality of signals may include inertial signals.

In accordance with another embodiment, a system has 1) a MEMS device producing a first signal in a first channel and a second signal in a second channel, and 2) an amplifier receiving the first and second signals and producing first and second output signals. The first and second output signals are in different channels.

In illustrative embodiments, an amplifier avoids aliasing amplifier noise by not sampling the input signal (and amplifier noise). By continuously reading the signal in one polarity or the other, and demodulating continuously, only input signals converted to the modulation frequency and the amplifier noise near the modulation frequency (but not its harmonics) appear at the demodulator outputs. Illustrative embodiments permit demodulation of two input signals (their clocks) in quadrature, for example, without introducing harmonics of the amplifier noise. Neither signal is sampled. Each signal appears as clock-frequency noise at the output of the other signal's demodulator. A low-pass filter eliminates the zero-mean clock-frequency noise.

Likewise, a third signal can be added in such a manner that each signal appears as a zero-mean clock-frequency signal on the other demodulator outputs. For example, the clock frequency of the third signal can be half that of the first two signals. The technique is not limited to three signals. As long as clock signals can be devised such that each channel appears as a zero-mean signal at all other demodulator outputs, further signals may be added.

In accordance with another embodiment, a method of processing a signal controls an amplifier to amplify an input signal having a plurality of different channels to produce an amplified input signal having the plurality of different channels. Next, the method demodulates the amplified input signal to produce at least one demodulated signal for each channel. Demodulating the signal, however, causes each demodulated signal to have noise relating to at least one other channel. The method then filters each demodulated signal to mitigate the noise to produce a baseband signal for each of the plurality of channels. Each baseband signal then is forwarded from at least one output node.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

Rather than using a sampling process, which undesirably causes aliasing noise, illustrative embodiments substantially continuously process multiple channels of data in a manner that minimizes distortion or noise. To that end, such embodiments employ an amplifier and filter that cooperate to simultaneously process those multiple channels of data. Details of illustrative embodiments are discussed below.

Figure 1:
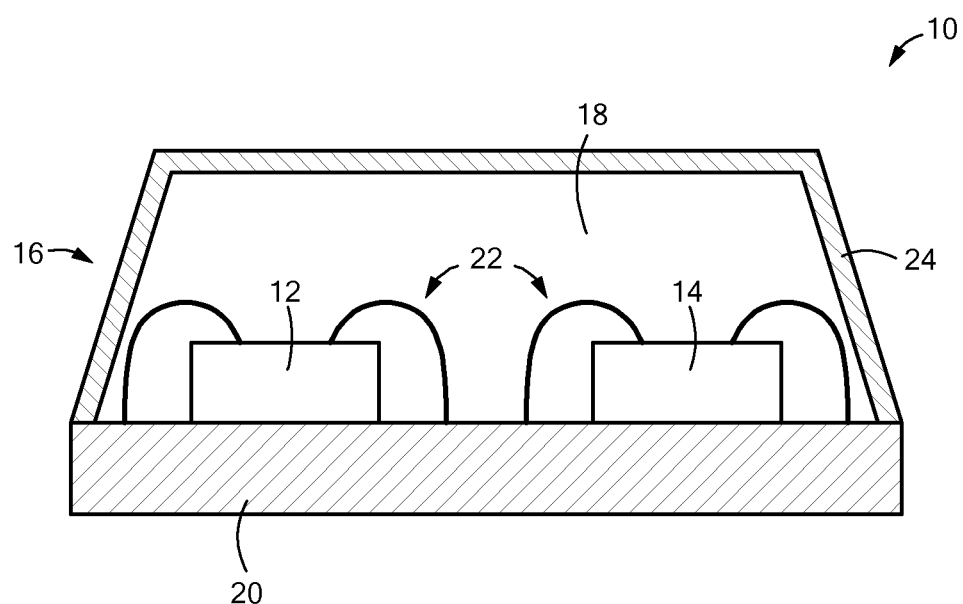
FIG. 1 schematically shows a cross-sectional view of a MEMS device 10 that may implement illustrative embodiments of the invention.

FIG. 1 schematically shows a cross-sectional view of a MEMS device 10 that may implement illustrative embodiments of the invention. Although various embodiments are discussed with reference to a MEMS device or accelerometer, those skilled in the art should understand that such embodiments also apply to other devices that generate multiple channels of data. Accordingly, discussion of a MEMS device and accelerometer is to illuminate various embodiments and is not intended to limit all embodiments of the invention.

Among other things, the MEMS device 10 of FIG. 1 implements an accelerometer system, which, as known by those skilled in the art, detects acceleration. For example, accelerometers are widely used in automobile safety control systems to deploy airbags in the event of a crash that causes a rapid negative acceleration. Specifically, upon receipt of an accelerometer signal indicating a rapid negative acceleration, the underlying safety system will substantially immediately deploy its airbags, protecting the occupants of the automobile.

Figure 2:
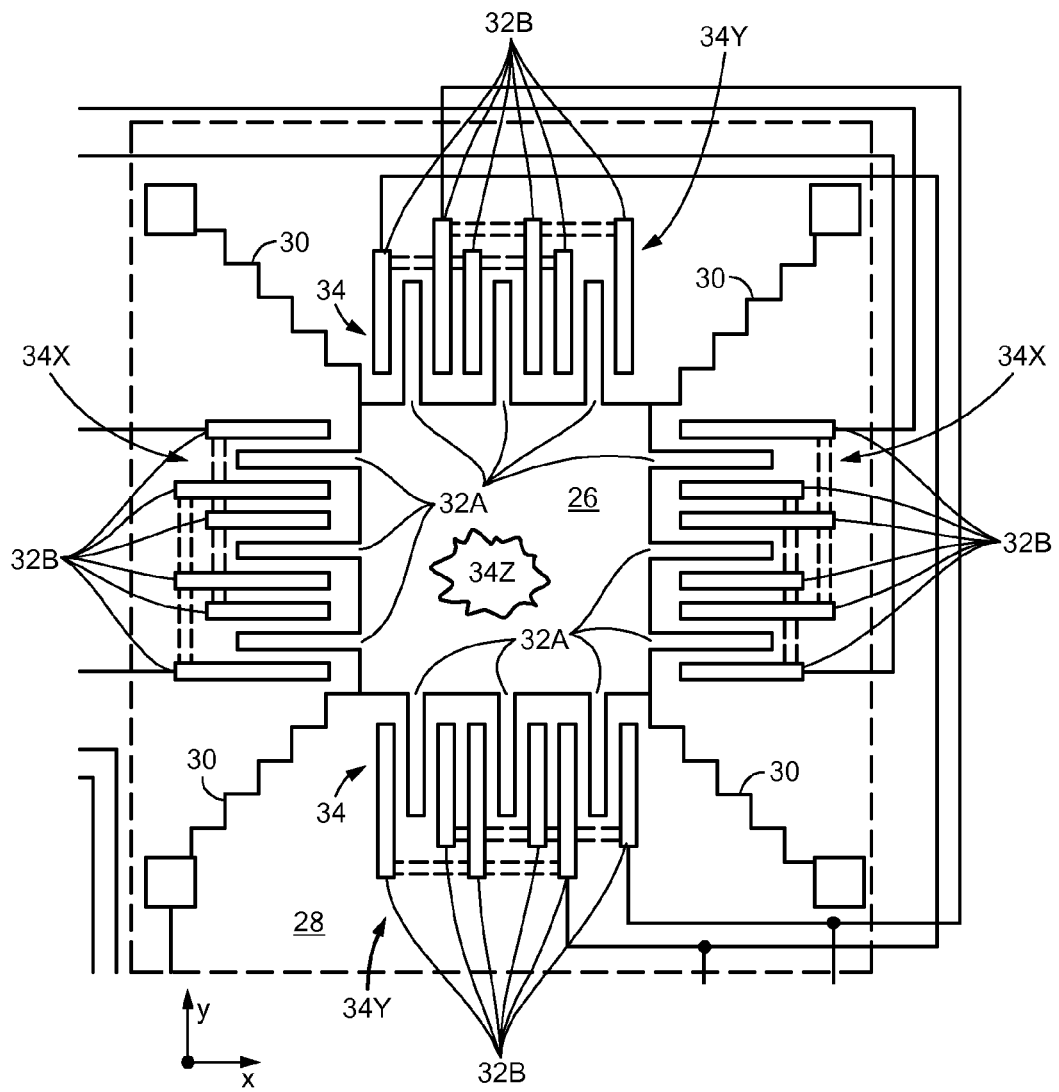
FIG. 2 schematically shows a plan view of the accelerometer chip shown in FIG. 1.

To those ends, the accelerometer has an accelerometer chip 12 with microstructure that moves in response to an acceleration (discussed in greater detail with respect to FIG. 2). To control its performance, this accelerometer chip 12 has electronic circuitry that is either on-chip with the microstructure, or off-chip. As an example, FIG. 1 shows this circuitry in a separate application specific integrated circuit chip (referred to herein as "ASIC 14") that electrically communicates with the accelerometer chip 12.

A conventional semiconductor package 16 encloses the accelerometer chip 12 and ASIC 14 within an internal chamber 18 that is substantially isolated from the external environment. The embodiment shown in FIG. 1 has a base 20 with internal electronic interconnections that electrically communicate the accelerometer chip 12 and ASIC 14 through conventional wirebonds 22. Pads (not shown) on the bottom surface of the base 20 of electrically communicate the accelerometer chip 12 and ASIC 14 with external system components, such as an underlying printed circuit board.

Any of a number of different packaging technologies should suffice. For example, among other things, the package 16 could incorporate a ceramic cavity package with a cover/lid, a substrate package having a cover, or a premolded or post molded leadframe package.

A lid 24 secured to the base 20 forms the internal chamber 18 for protecting and containing the accelerometer chip 12 and ASIC 14. Among other ways, the lid 24 may be secured to the base 20 using a heated glass frit or other conventional connecting process. Some embodiments may apply a ground potential to the lid 24 to prevent interference with the accelerometer chip 12. To further protect and facilitate accelerometer performance, the internal chamber 18 may be under a vacuum, and/or have an internal gas to provide squeeze film dampening for the accelerometer microstructure.

FIG. 2 schematically shows a plan view of the accelerometer chip 12 shown in FIG. 1. In simplified terms, as known by those skilled in the art, the accelerometer has a movable mass 26 suspended over a substrate 28 by a plurality of springs 30. The substrate 28 is fixedly secured to a surface, such as the base 20 of the package 16, while the mass 26 can move relative to the substrate 28 and the underlying surface. Accordingly, if in accelerometer moving at a substantially constant velocity suddenly stops, the movable mass 26 continues moving ahead in the same direction. As known by those in the art, this mass movement is related to the acceleration. The ASIC 14 or other circuitry electrically detects this movement, converting it into a data signal indicating the amount of acceleration.

The accelerometer shown in FIG. 2 has a single mass 26 suspended at each of its corners by four springs 30. Alternative embodiments may have plural masses. Illustrative embodiments form the springs 30 in a serpentine shape for optimum mass control. This accelerometer is capable of detecting accelerations along the three orthogonal axes; namely along the X-axis, the Y-axis, and the Z-axis. To that end, the mass 26 has a plurality of fingers 32A extending from each of its side surfaces. Each of these fingers 32A forms of differential, variable capacitor (generally identified by reference number "34") with a pair of stationary fingers 32B secured to the substrate 28. It is these variable capacitors 34 that primarily "pick up" acceleration along the X-axis and the Y-axis. In other words, each mass finger 32A forms of first plate of a variable capacitor 34, while the stationary fingers 32B form stationary plates in the same variable capacitor 34. All of the variable capacitors 34 measuring acceleration in a single dimension thus effectively form a single variable capacitor 34. Fingers 32A and 32B configured in this manner are often referred to as being "interdigitated."

The substrate 28 also has a single fixed electrode directly underneath the mass 26 to form a third variable capacitor 34Z (with the mass 26) that measures acceleration along the Z-axis (i.e., orthogonal to the X and Y axes, or, in other words, orthogonal to the faces of the movable mass 26). This third variable capacitor 34Z is shown schematically in a cut-away view of FIG. 2. The output signals of these three capacitors 34 and 34Z are considered to be in three different channels.

Since it detects acceleration in three dimensions, the MEMS system 10 is known in the art as a 3-axis accelerometer. Various embodiments, however, apply to accelerometers that detect acceleration in fewer than three dimensions, such as two-dimension accelerometers.

During operation, circuitry on the ASIC 14 energizes the capacitors 34. For example, the plates of the capacitors 34 may have a net voltage of zero when at rest. Movement of the mass 26 thus changes that voltage, generating a signal (e.g., a non-zero voltage) indicating an acceleration. To transmit signals from all three capacitors 34 across a single line, prior art designs known to the inventor apply a time division multiplex signal ("TDM signal") to each of these capacitors 34 as they await and detect accelerations. One problem with using TDM signals, as suggested above, is that they effectively sample signals, creating aliasing noise in the transmission line. Undesirably, this aliasing noise decreases the signal to noise ratio. Larger MEMS devices thus are required to overcome this noise penalty. Larger MEMS devices, however, are more costly and often less desirable.

To overcome this problem, the inventor discovered that application of substantially constant actuation signals to the variable capacitors 34, and substantially continuous processing (by demodulators, discussed below) mitigates this noise, thus enabling use of smaller accelerometers.

Figure 3:
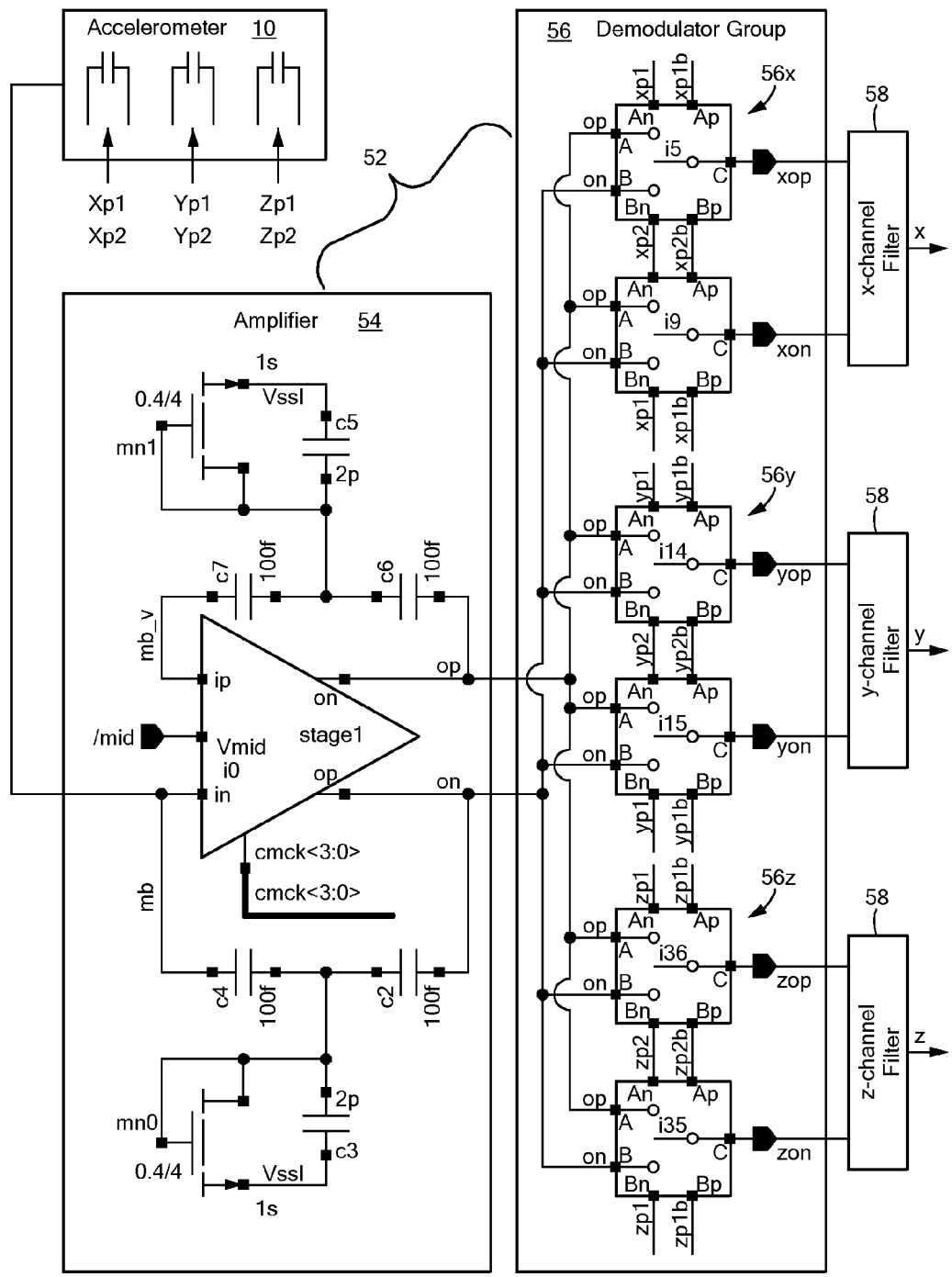
FIG. 3 schematically shows a circuit diagram of a system of detecting acceleration along three axes, and producing three signals representing the acceleration along each of those axes.

To that end, FIG. 3 schematically shows a circuit diagram of a system of detecting acceleration along three axes, and producing three signals representing the acceleration along each of those axes. Accordingly, the system generates an X-acceleration signal representing acceleration along the X-axis, a Y-acceleration signal representing acceleration along the Y-axis, and a Z-acceleration signal representing acceleration along the Z-axis. The circuitry portion of this figure may be implemented on the ASIC 14, on the same chip as the accelerometer, 10, or across both chips 12 and 14. As noted herein, discussion of this specific example of an accelerometer is illustrative and can apply to other devices, such as a gyroscope, a different type of accelerometer, or other device.

The system has a MEMS accelerometer 12 with the above noted three variable capacitors 34X, 34Y, and 34Z for both detecting those acceleration signals, and generating output signals for each of the three channels. An amplifier 52 receives and processes those three channels of data for ultimate use by other devices, such as a computer or microprocessor. The amplifier 52 thus has an amplifier 54 with an input coupled with the movable mass 26 of the accelerometer 10, and a demodulator group 56 for demodulating and converting the signals into baseband signals for each channel.

More specifically, the amplifier 54 preferably comprises an operational amplifier ("op-amp"). To that end, FIG. 3 schematically shows various capacitors, capacitor values, and switches of one implementation of such an amplifier 54. Of course, the specific values and configuration of the amplifier arrangement is but one of many potential arrangements and thus, serves primarily as an example of one embodiment. In some embodiments, the amplifier 54 includes a lock-in amplifier. In various other embodiments, however, the amplifier 54 is another type of amplifier.

The movable mass 26 is connected to the negative input "In" of the op-amp, while "Vmid" is a common-mode reference. Accordingly, the op-amp substantially continuously receives the signals for the X, Y, and Z channels through the same input—the negative input In of the op-amp. To effectively differentiate those signals, the three channels generate their respective signals in accordance with timing/clock signals shown in FIG. 4. In fact, those timing signals are used throughout the system, as discussed below with regard to the demodulator group 56.

Figure 4:
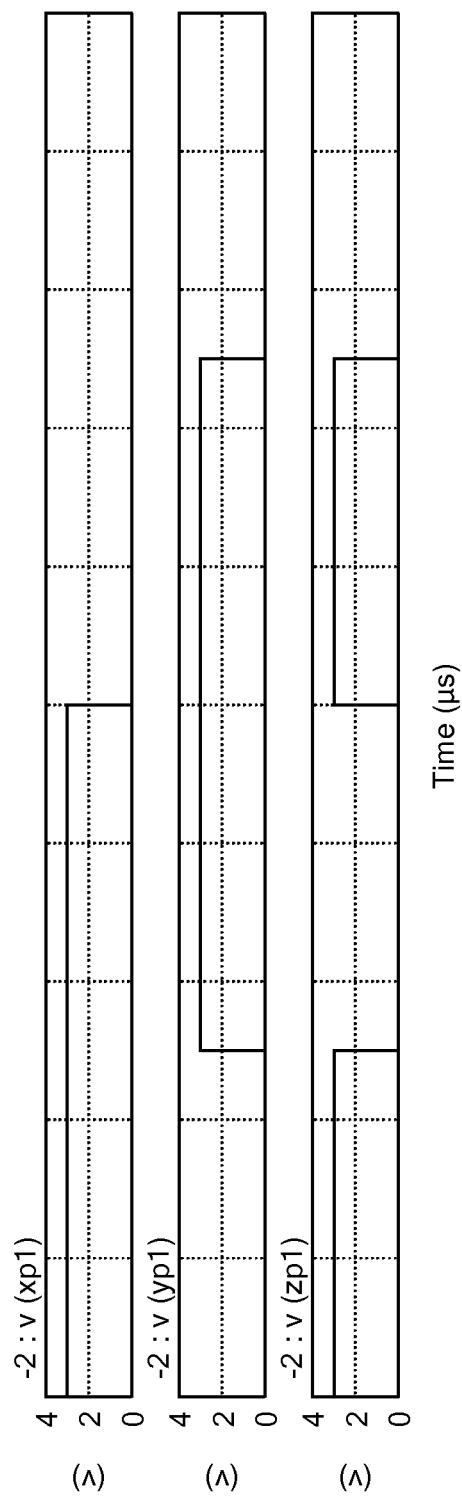
FIG. 4 schematically shows clock signals for use in the system of FIG. 3.

In illustrative embodiments, the timing signals have the same frequency and are in quadrature with each other (i.e., the signals are ninety degrees out of phase with one another). FIG. 4 shows such signals, where signal XP1 and YP1 are in quadrature with each other, and signal ZP1 is two times the frequency of the X and Y channels. In other or related embodiments, the timing signals merely have coincident edges, as also shown in FIG. 4. Moreover, rather than being the same frequency, certain of the timing signals can be multiples of two times the frequency of one or more of the other timing signals.

Specifically, the frequency of the signals can comply with the following equation:

$$F = 2^N * A$$

where N is a positive or negative integer and A is the frequency of one of the timing signals.

For example, the X channel can have a frequency of F, while the Y channel can have a frequency of F*2 and the Z channel can have a frequency of F*4. As another example, the X channel can have a frequency of F, while the Y channel can have a frequency of F/2 and the Z channel can have a frequency of F/4.

The outputs of the op-amp, designated as a differential output as "op" and "on," are coupled with the input(s) of the demodulator group 56, which also are designated as differential input(s) "op" and "on." In other embodiments, the inputs and outputs may be single ended inputs and outputs.

The demodulator group 56 preferably comprises a group of full wave demodulators, without sampling, for demodulating the three channels in parallel. To that end, the demodulator group 56 has three primary demodulators: the X-channel demodulator 56X, the Y-channel demodulator 56Y, and the Z-channel demodulator 56Z. Each demodulator 56 comprises a switching arrangement to 1) receive the output of the op-amp, which includes all three channels of data, and 2) demodulate its designated channel. Accordingly, each demodulator depends upon the timing channel for its specific channel as shown in FIG. 4 to appropriately demodulate its respective channel.

Each demodulator 56 thus has a corresponding output for forwarding its respective signal toward downstream components. FIG. 3 designates those outputs as differential outputs Xop and Xon, Yop and Yon, and Zop and Zon. Undesirably, however, the demodulator group 56 generates a certain amount of noise on each of its outputs. Specifically, in some embodiments, the demodulation process causes each channel's signal to appear as clock frequency noise at the output of the other signal's demodulator. For example, during demodulation, an X-channel demodulator 56 receives the amplified signals of an X-channel, a Y-channel, and a Z-channel. The X-channel demodulator 56 desirably produces the baseband X-channel signal but, undesirably, it also produces noise related to the received signals for the Y-channel and Z-channel. This noise has a higher frequency than the baseband X-channel signal.

Accordingly, the system also has a plurality of filters 58 to mitigate that noise, eliminating zero-mean clock-frequency noise, thus producing a signal with a higher signal-to-noise ratio. These filters 58 may or may not be considered part of the amplifier 52.

More specifically, the demodulator group 56 generates noise that is higher than the low frequency desired output signals. The filters 58 thus are low pass filters that each substantially mitigates high frequency signals, consequently primarily permitting the signals of the three data channels to pass. In other words, each filter 58 has a cutoff that is selected to mitigate high frequency noise of the other channels. FIG. 3 schematically shows each filter as X-channel filter with output X, Y-channel filter with output Y, and Z-channel filter with output Z.

Although the above discussion discloses various exemplary embodiments of the invention, it should be apparent that those skilled in the art can make various modifications that will achieve some of the advantages of the invention without departing from the true scope of the invention. For example, as noted, various embodiments are not limited to three channels. Some embodiments apply to two channels of data, or more than three channels of data in applications that are either related or unrelated to a MEMS accelerometer. In addition, discussion of MEMS devices, or accelerometers, is not intended to limit various embodiments.

What is claimed is:

1. A signal transmission system comprising:
    an amplifier configured to amplify an input signal having a plurality of different channels to produce an amplified input signal having the plurality of different channels;
    a demodulator group configured to demodulate the amplified input signal to produce at least one demodulated signal for each channel, demodulating causing each demodulated signal to have noise relating to at least one other channel, the demodulator group comprising:
        a first-channel demodulator comprising a switching arrangement controlled by a first-channel drive signal to produce a first baseband signal; and
        a second-channel demodulator comprising a switching arrangement controlled by a second-channel drive signal to produce a second baseband signal;
        a first filter in communication with the first-channel demodulator and configured to mitigate the noise on the first baseband signal;
        a second filter in communication with the second-channel demodulator and configured to mitigate the noise on the second baseband signal;
    a first output coupled to the first filter and configured to transmit a filtered version of the first baseband signal; and
    a second output coupled to the second filter and configured to transmit a filtered version of the second baseband signal.

2. The signal transmission system as defined by claim 1, wherein each channel in the input signal has an associated clock, all of the clocks having frequencies that are related by multiples of 2 or multiples of 0.5.

3. The signal transmission system defined by claim 1 wherein the noise comprises high frequency noise, and the filters have a low-pass cutoff frequency for each channel that is less than the frequency of the noise generated by the demodulator for the other channel, to mitigate the high frequency noise.

4. The signal transmission system as defined by claim 1 wherein each channel in the input signal has an associated input clock, the input clocks being in quadrature.

5. The signal transmission system as defined by claim 1 wherein the input signal is from a MEMS device, the plurality of different channels relating to at least two orthogonal axes of the MEMS device in a Cartesian coordinate system.

6. The signal transmission system as defined by claim 1 wherein the amplifier, demodulators, and filters are configured to operate continuously without sampling.

7. A method of processing a signal produced by a MEMS device having a beam movable in a plurality of axes, the MEMS device having a first-axis variable capacitor disposed to respond to motion of the beam along a first axis, the first-axis variable capacitor driven by a periodic first-axis drive signal having a first-channel drive frequency, and also having a second-axis variable capacitor disposed to respond to motion of the beam along a second axis, the second-axis variable capacitor driven by a periodic second-axis drive signal having a second-channel drive frequency, the method comprising:
    providing an amplifier having an amplifier input electrically coupled to the first-axis variable capacitor and the second-axis variable capacitor, to amplify first-axis motion and second-axis motion signals from the first-axis variable capacitor and the second-axis variable capacitor, respectively;
    providing a plurality of demodulators operatively coupled with the amplifier for receiving amplified input signals from the amplifier, each demodulator comprising a switching arrangement, the plurality of demodulators comprising:
        a first-channel demodulator coupled to the periodic first-axis drive signal and operable to demodulate the amplified motion signals to produce a first-axis output signal including second-axis noise; and
        a second-channel demodulator coupled to the periodic second-axis drive signal and operable to demodulate the amplified motion signal to produce a second-axis output signal including first-axis noise;
    filtering the first-axis output signal through a first-channel low-pass filter coupled to the first-channel demodulator, the first-channel low-pass filter having a cutoff frequency below the frequency of the second-axis noise generated by the second-channel demodulator; and
    filtering the second-axis output signal noise through a second-channel low-pass filter coupled to the second-channel demodulator, the second-channel low-pass filter having a cutoff frequency below the frequency of the first-axis noise generated by the first-channel demodulator;
    the filters mitigating the noise on their respective channels.

8. The method of processing a signal as defined by claim 7 wherein the amplifier has a differential output comprising a non-inverting output node and an inverting output node; and wherein
    the first-channel demodulator comprises:
        a first switch having a first switch output, a first positive input coupled to the non-inverting amplifier output node, and a first negative input coupled to the inverting amplifier output node, the first switch driven by the periodic first-axis drive signal to couple the non-inverting amplifier output node to the first switch output during a first phase of the periodic first-axis drive signal, and to couple the inverting amplifier output to the first switch output during a second phase of the periodic first-axis drive signal; and
        a second switch having a second switch output, a second positive input coupled to the non-inverting amplifier output node, and a second negative input coupled to the inverting amplifier output node, the second switch driven by the periodic first-axis drive signal to couple the inverting amplifier output node to the second switch output during the first phase of the periodic first-axis drive signal, and to couple the non-inverting amplifier output to the second switch output during the second phase of the periodic first-axis drive signal.

9. The method of processing a signal as defined by claim 8, wherein:
the second-channel demodulator comprises:
a third switch having a third switch output, a third positive input coupled to the non-inverting amplifier output node, and a third negative input coupled to the inverting amplifier output node, the third switch driven by the periodic second-axis drive signal to couple the non-inverting amplifier output node to the third switch output during the first phase of the periodic second drive signal, and to couple the inverting amplifier output to the third switch output during the second phase of the periodic second-axis drive signal; and
a fourth switch having a fourth switch output, a fourth positive input coupled to the non-inverting amplifier output node, and a fourth negative input coupled to the inverting amplifier output node, the fourth switch driven by the periodic second-axis drive signal to couple the inverting amplifier output node to the fourth switch output during the first phase of the periodic second-axis drive signal, and to couple the non-inverting amplifier output to the fourth switch output during the second phase of the periodic second-axis drive signal.

10. The method of processing a signal as defined by claim 7 wherein the input signals have clocks that are in quadrature.

11. The method of processing a signal as defined by claim 10 wherein the input signals have clocks that have substantially the same frequencies.

12. The method of processing a signal as defined by claim 7 wherein the input signals have clocks with coincident edges and frequencies that are related by multiples of 2 or multiples of 0.5.

13. The method of processing a signal as defined by claim 7 wherein each demodulator demodulates a signal for a different channel than those demodulated by the other demodulators.

14. A signal transmission system comprising:
a demodulator group receiving an output signal of a first stage, the output signal having a plurality of modulated signals associated with a plurality of channels, the demodulator group configured to demodulate the output signal to produce at least one demodulated signal for each channel, the demodulator group comprising:
a first-channel demodulator comprising a switching arrangement controlled by a first-channel drive signal to produce a first baseband signal; and
a first filter in communication with the first-channel demodulator and configured to mitigate noise on the first baseband signal;
a first output coupled to the first filter and configured to transmit a filtered version of the first baseband signal;
a second-channel demodulator comprising a switching arrangement controlled by a second-channel drive signal to produce a second baseband signal;
a second filter in communication with the second-channel demodulator and configured to mitigate noise on the second baseband signal; and
a second output coupled to the second filter and configured to transmit a filtered version of the second baseband signal.

15. The signal transmission system as defined by claim 14, wherein each channel in the input signal has an associated clock signal, all of the clock signals having frequencies that are related by multiples of 2 or multiples of 0.5.

16. The signal transmission system defined by claim 14 wherein the noise comprises high frequency noise between the first and second channels, and the first filter has a low-pass cutoff frequency that is less than the frequency of the noise generated by the demodulator for the second channel, to mitigate the high frequency noise.

17. The signal transmission system as defined by claim 14 wherein each channel in the input signal has an associated input clock, the input clocks being in quadrature.

18. The signal transmission system as defined by claim 14 wherein the input signal is from a MEMS device, the plurality of different channels relating to at least two orthogonal axes of the MEMS device in a Cartesian coordinate system.

19. The signal transmission system as defined by claim 14 wherein the demodulators and filters are configured to operate continuously without sampling.

20. The signal transmission system according to claim 14 wherein the signal transmission system is coupled to a MEMS accelerometer.

* * * * *